United States Patent [19]
Jeong

[11] Patent Number: 5,862,098
[45] Date of Patent: Jan. 19, 1999

[54] WORD LINE DRIVER CIRCUIT FOR SEMICONDUCTOR MEMORY DEVICE

[75] Inventor: Jae-Hong Jeong, Seoul, Rep. of Korea

[73] Assignee: LG Semicon Co., Ltd., Choongcheongbuk-Do, Rep. of Korea

[21] Appl. No.: 931,613

[22] Filed: Sep. 16, 1997

[30]     Foreign Application Priority Data

Sep. 17, 1996  [KR]  Rep. of Korea ................... 40329/1996

[51] Int. Cl.⁶ ....................................................... G11C 8/00
[52] U.S. Cl. .................................. 365/230.06; 365/230.03
[58] Field of Search ........................ 365/230.03, 230.06, 365/189.11, 191

[56]             References Cited

U.S. PATENT DOCUMENTS 4,542,486   9/1985   Anami et al. ........................... 365/230

5,416,748   5/1995   Fujita ................................. 365/230.06

*Primary Examiner*—Do Hyun Yoo
*Attorney, Agent, or Firm*—Morgan, Lewis & Prockius LLP

[57]            ABSTRACT

A word line driver for a semiconductor memory device includes a row decoder for generating a block select signal and driving a main word line in accordance with an address signal, a sub word line enable unit for generating a main decoding signal in accordance with the address signal, a word decoder driver for buffering the main decoding signal and transmitting the main decoding signal to a memory cell block, a block word decoder driver for enabling a sub decoding signal in the memory cell block in accordance with the block select signal and the main decoding signal, and a sub word line driver for driving a sub word line in accordance with the sub decoding signal and the main word line driven by the row decoder.

11 Claims, 8 Drawing Sheets

WORD LINE DRIVER CIRCUIT FOR SEMICONDUCTOR MEMORY DEVICE

This application claims the benefit of Korean Application Number 40329/1996 filed on Sep. 17, 1996, which is hereby incorporated by reference.

BACKGROUND OF THE INVENTION

1. Field of the Invention

The present invention relates to a semiconductor memory device, and more particularly, to an improved word line driver circuit for a semiconductor memory device.

2. Discussion of the Related Art

Since word lines in early semiconductor memory devices were composed of polysilicon, which has a relatively high resistance, the time required for a decoding signal to be transmitted from a word line decoder to a memory cell, that is, the data access time, was very long.

A technique for solving the above problem was disclosed in the U.S. Pat. No. 4,542,486 and shown in FIG. 1, wherein a metal layer is formed on each word line. Referring to FIG. 1, a memory cell array 1 is divided into a plurality of blocks (1A, 1B, 1C). Each word line is divided into a main word line 15 and sub word lines 3A, 3B, 3C composed of metal material and having an AND gate with a small resistance and a small parasitic capacitance. Only a word line in a specific block is made to be operated in accordance with a cell block select signal.

The operation of the above word line structure will now be described. First, when one of the column decoders (not illustrated) arranged in the y-direction is enabled in accordance with a column address signal, a corresponding main word line becomes high to be active. Then, a specific block is selected by an address in the x-direction, and a block select signal also becomes high. As a result, one of the AND gates 16A, 16B, 16C is turned on to enable a corresponding sub word line, thus completing the operation.

The above-described construction works well in a semiconductor memory device having a small capacity. However, for a device having 64 mega bits or greater capacity, when a metal layer is formed on each word line, the chip area is accordingly increased. This makes practical application of this construction to semiconductor memory devices almost impossible. Furthermore, since the block select signal is used as a gate input signal and is simultaneously inputted to a plurality of AND gates, the load capacity of the block select signal is increased and the enabling speed of the sub word lines becomes slower, resulting in the increased power consumption due to the large load capacity.

Accordingly, as shown in FIG. 2, in a 64 mega bits or greater level device, to improve the enabling speed of the sub word lines in the arrangements of FIG. 1, one metal layer is allocated to a plurality of word lines having a hierarchial structure. In addition, a driving unit is disposed to selectively connect the word lines and the metal layer.

The semiconductor memory device structure shown in FIG. 2 is disclosed in the U.S. Pat. No. 5,416,748, in which one metal layer is connected to a plurality of word lines. The device structure includes a plurality of main word lines (MWL-1, ..., MWL-n) composed of a metal material, and a plurality of sub word lines (SWL) connected to one main word line. A column decoder 10 generates a column address. Sub word line driving units (SWD) 20 select a specific sub word line among the plurality of sub word lines. A sense amplifier 30 amplifies a signal of the selected word line. A block decoder (BD) 40 outputs a block select signal. Word line drive decoders (WDD) 50 drive the word lines, and sub decoding drive units (SDD) 60 select one of the word line drive decoders (WDD) 50.

As shown in FIG. 3, each word line drive decoder (WDD) 50 includes NAND gates 51 and 511 each receiving a block select signal (AI1) and the respective main word line decoding signals AI2 and AI3. Inverters 52 and 521 respectively invert the output signal from the NAND gates 51 and 511. A level shifter including PMOS and NMOS transistors converts an inputted voltage (V).

The operation of the semiconductor memory device having the above-described word line drive unit will now be described. The column address enables the column decoder 10 located in the y-direction to make one main word line high to be active, and this main word line then transmits the resultant high active main word line signal to all of the sub word line drive units (SWD) connected thereto. Then, the column address is inputted to the sub decoding drive units (SDD) disposed in the x-direction which make one of the decoding signals of one column high to be active.

The resultant high active decoding signal is transmitted to the word line drive decoder (WDD) of that column as shown in FIG. 3 to drive a selected block, together with a decoding signal from the block decoder 40 enabled by the column address.

In the active word line drive decoder (WDD), the decoding signal is made to be a sub decoding signal for applying power to a sub power node of the sub word line drive unit (SWD) in the selected block. The sub word line drive unit (SWD) located where the high active main word line and the sub decoding signal cross is made active to drive a sub word line.

However, according to the word line drive decoder structure shown in FIG. 3, the block select signal and the sub decoding signal are inputted to the NAND gates, and a plurality of sub word line driving units are simultaneously enabled, resulting in the increased power consumption. Since a sub decoding drive unit is provided in each block, an overlapping power consumption results. Moreover, since a word line drive decoder including the NAND gate, the inverter and a level shifter, and a sub decoding drive unit must be provided in each block, the layout area in fabricating a chip is increased.

SUMMARY OF THE INVENTION

Accordingly, the present invention is directed to a word line driver circuit for a semiconductor memory device that substantially obviates one or more of the problems due to limitations and disadvantages of the related art.

An object of the present invention is to provide an improved semiconductor memory device which is capable of reducing a data access time without increasing a layout area and the associated power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the word line driver circuit for a semiconductor memory device includes a row decoder for generating a block select signal and driving a main word line in accordance with an address signal, a sub word line enable unit for generating a main decoding signal in accordance with the address signal, a word decoder driver for buffering the main decoding signal and transmitting it to a memory cell block, a block word decoder driver for enabling a sub decoding signal in a corresponding block in accordance with the block select signal and the main decoding signal, and a sub word line driver for driving a corresponding sub word line in accordance with the sub decoding signal and the driving of the main word line by the row decoder.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
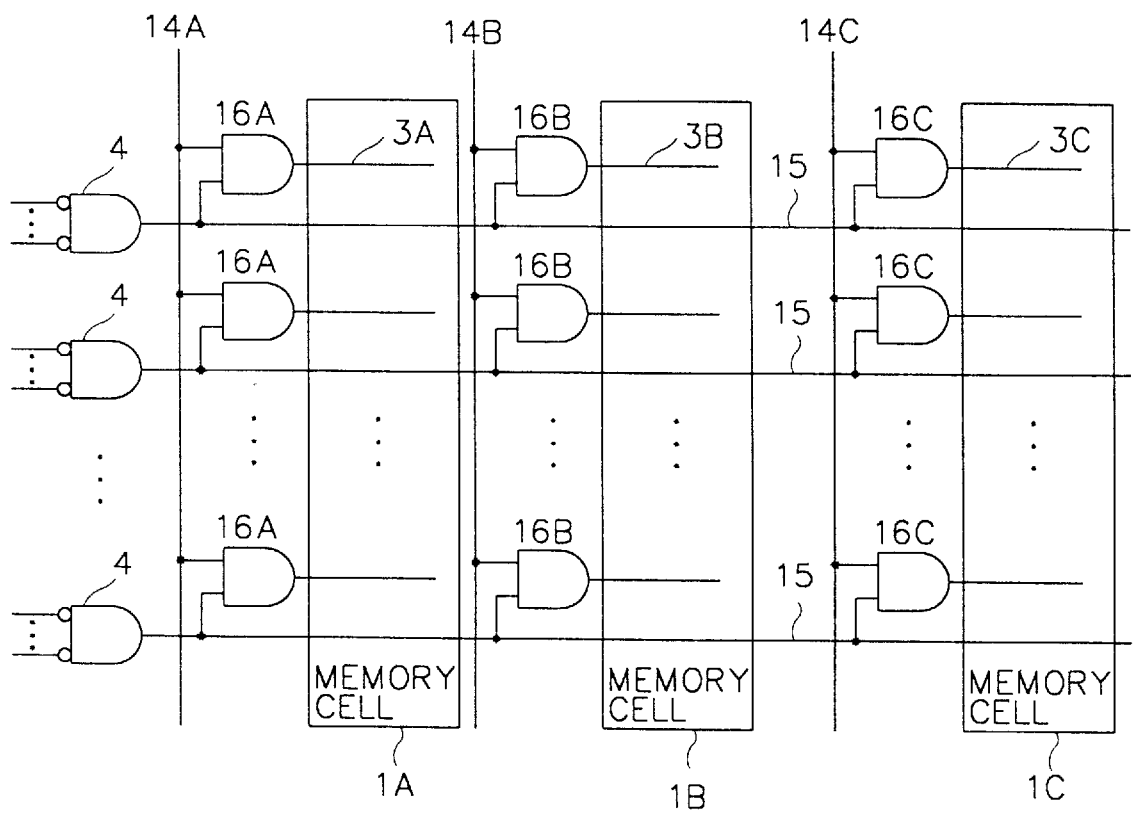
FIG. 1 is a schematic block diagram of a semiconductor memory device according to the conventional art.
Figure 2:
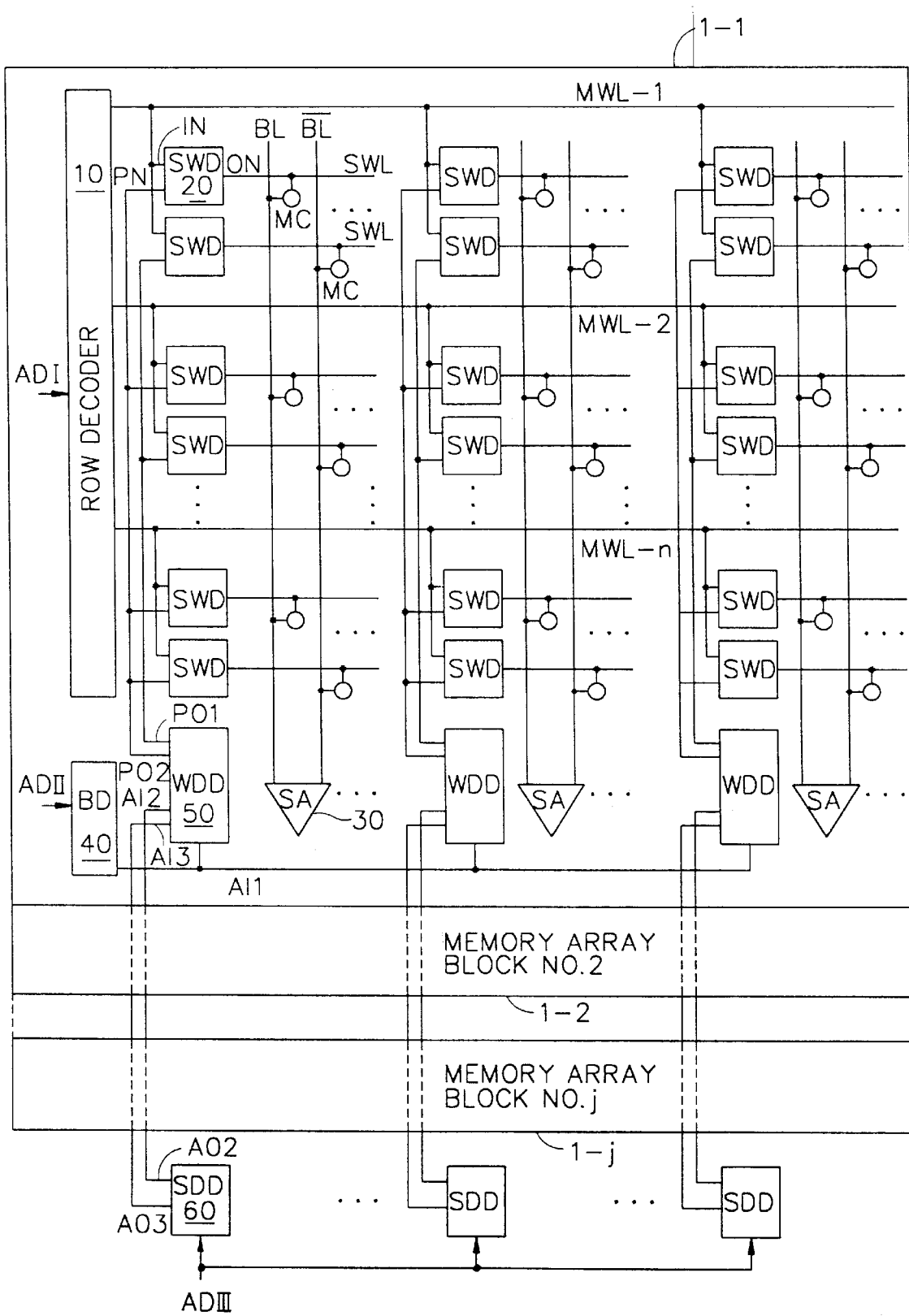
FIG. 2 is a schematic block diagram showing the construction of another semiconductor memory device according to the conventional art.
Figure 3:
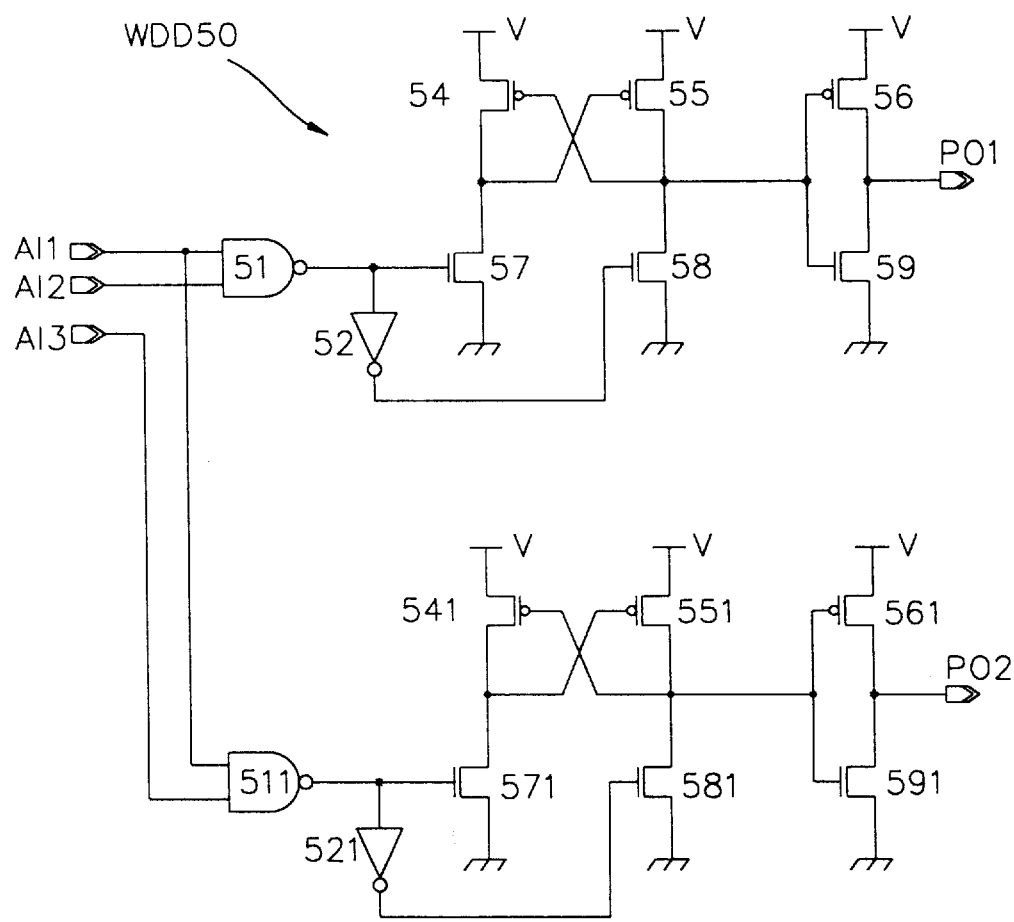
FIG. 3 is a detailed schematic circuit diagram of a word line drive decoder of FIG. 2.
Figure 4:
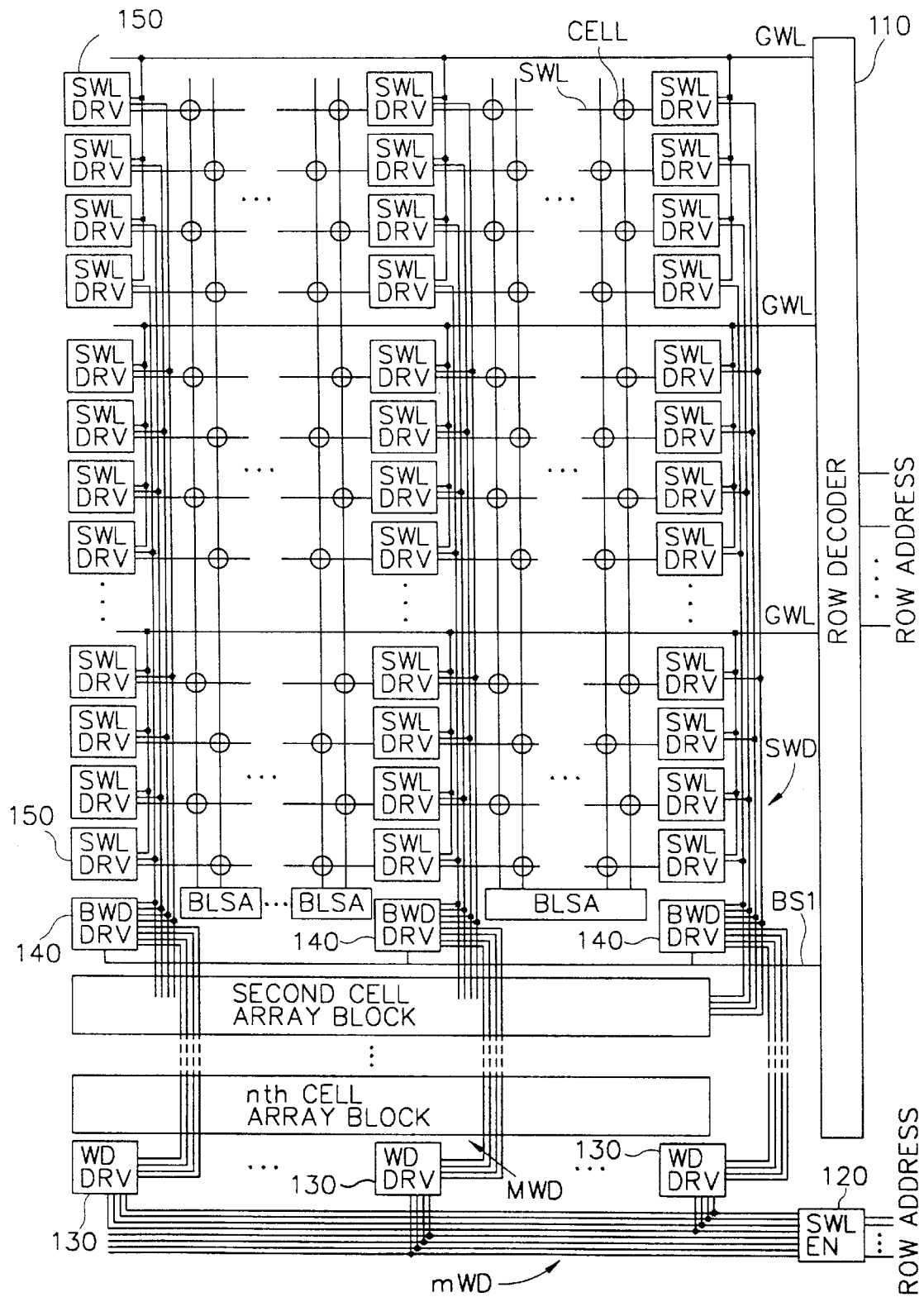
FIG. 4 is a block diagram showing a construction of a semiconductor memory device according to a first embodiment of the present invention.

FIG. 4 is a schematic block diagram of an internal word line driving circuit in a semiconductor memory device according to a first embodiment of the present invention. A row decoder 110 arranged in the y-direction receives a row address signal and carries out a decoding operation for generating a block select signal (BS1) to enable a block having a specific sub word line driver 150 (SWLDRV). A sub word line enable unit 120 (SWLEN) arranged in the x-direction generates a main decoding signal (MWD) by decoding the row address signal for a decoding signal of the sub word line driver 150. A plurality of word decoder drivers 130 (WDDRV) each performs a buffering to drive the main decoding signal to a cell array block. A plurality of block word decoder drivers 140 (BWDDRV) each enables a sub decoding signal in a specific block in accordance with the block select signal (BS1) and the main decoding signal (MWD). A plurality of sub word line drivers 150 (SWLDRV) each drives a sub word line in accordance with a high active main word line (GWL) and the sub decoding signal.

The operation of the semiconductor memory device having a word line driving circuit according to the present invention will now be described.

The row decoder 110 receives a row address signal to enable one of the main word lines (GWL) and generates the block select signal (BS). The sub word line enable unit 120 receives the row address signal, makes one of the main decoding signals (MWD) to be active (i.e., high), and transmits the resultant high active signal to the block word decoder drivers 140 through the word decoder drivers 130.

Here, the main decoding signal (MWD) is applied to a power node of the block word decoder drivers 140. The block word decoder drivers 140 enabled by receiving the block select signal (BS) and the main decoding signal (MWD) generates a sub decoding signal (SWD) to be transmitted to the sub word line drivers (SWLDRV) 150. The sub word line drivers 150 are connected to the main word lines (GWL) and receive the sub decoding signal (SWD) to drive the sub word lines. This completes the enablement operation.

Figure 5:
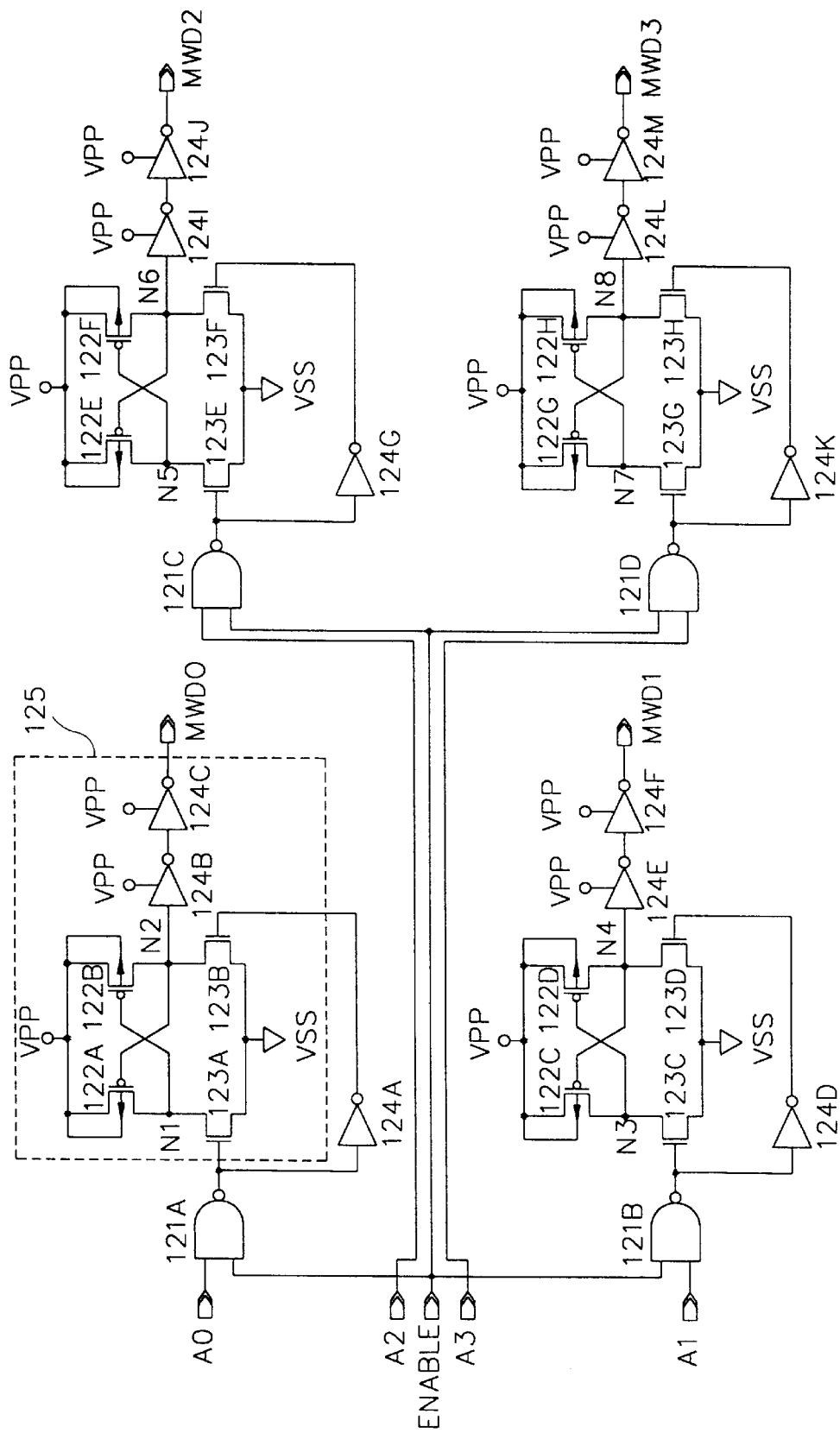
FIG. 5 is a detailed schematic circuit diagram of a sub word line enable unit in the memory device of FIG. 4.

The sub word line enable unit 120, as shown in FIG. 5, includes circuitry associated with each address line. The circuit for the first address line includes a NAND gate 121A to which one row address signal (A0) and an enable signal (ENABLE) are inputted. A first inverter 124A inverts an output from the NAND gate 121A, and a level shifter 125 shifts the output from the NAND gate 121A.

The level shifter 125 includes a PMOS transistor 122A connected between a voltage source VPP and a connection node N1 and with its gate connected to a connection node N2. The level shifter 125 also includes an NMOS transistor 123A connected between the connection node N1 and a ground voltage Vss with its gate connected to the output from the NAND gate 121A. The level shifter 125 further includes a PMOS transistor 122B connected between the voltage source VPP and the connection node N2 and with its gate connected to the connection node N1, and an NMOS transistor 123B connected between the connection node N2 and Vss, and with its gate connected to the signal outputted from the NAND gate 121A and inverted by the first inverter 124A. A second inverter 124B inverts a signal from the connection point N2, and a third inverter 124C inverts the output from the second inverter 124B.

When the row address signal A0 and the enable signal inputted to the NAND gate 121A are both "1" (high), a "0" is outputted by the NAND gate 121A so that the NMOS transistor 123A is turned off and the PMOS transistor 122B is turned on. The NMOS transistor 123B, to which the signal outputted from the NAND gate 121A and inverted in a first inverter 124A is inputted, is turned on. As a result, the electrical potential of the connection node N2 is made low "0", and this is inverted twice buffer-delayed through the second and third inverters 124B and 124C. Consequently, the original low electrical potential "0" of the connection point N2 is outputted on the main decoding signal line (MWDO). The construction and operation of the sub word line enable unit circuits associated with row address lines is identical to that described above.

Figure 6:
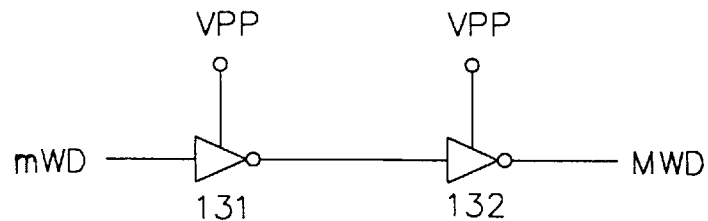
FIG. 6 is a detailed schematic circuit diagram of a word decoder driver in the memory device of FIG. 4.

The word decoder drivers 130 (WDDRV) of each block serve as boosting circuits, and their structures are shown in FIG. 6. Two inverters 131 and 132 are connected in series with each main decoding signal line for buffering the main decoding signals (MWD) supplied to respective blocks by the sub word line enable unit 120.

The block word decoder drivers 140 each enables a sub decoding signal in a block selected by the block select signal and the main decoding signal. Here, the main decoding signal applies power to the block word decoder driver 140.

Figure 7:
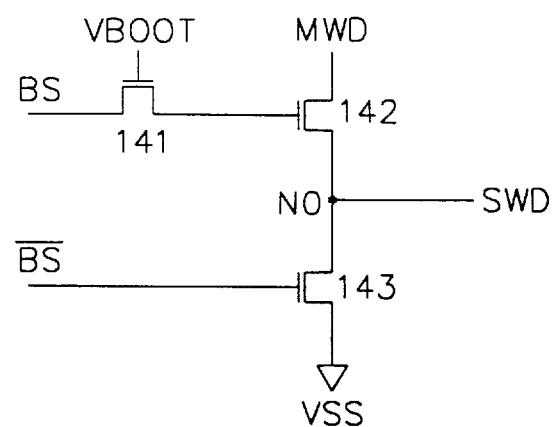
FIG. 7 is a detailed schematic circuit diagram of a sub word line driver in the memory device of FIG. 4.

As shown in FIG. 7, each block word decoder driver 140 includes an NMOS transistor 142 connected between each main decoding signal (MWD) line and an output connection node (N0), and with its gate applied with the block select signal (BS). A switching device 141 (e.g., a pass transistor) carries out a switching to apply the block select signal (BS), or prevent the block select signal (BS) from being applied, to the gate of the NMOS transistor 142 in response to a signal (VBOOT). An NMOS transistor 143 is connected between the output connection node (N0) and the ground voltage (VSS), and with its gate applied with an inverted block select signal (/BS). Each block word decoder driver 140 generates a sub decoding signal (SWD) in accordance with the block select signal and the main decoding signal applied thereto.

Figure 8:
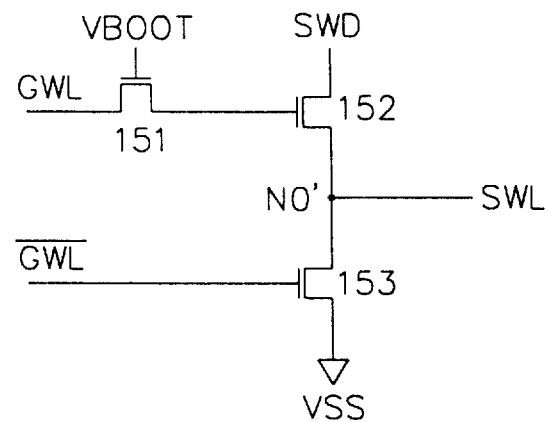
FIG. 8 is a detailed schematic circuit diagram of a block word decoder driver in the memory device of FIG. 4 according to an embodiment of the present invention.

The sub word line drivers 150, as shown in FIG. 8, each includes an NMOS transistor 152 connected between a sub decoding signal line (SWD) and an output connection node (N0'), and with its gate connected to a corresponding main word line (GWL). The output connection node (N0') is connected to a sub word line (SWL). A switching device 151 (e.g. a pass transistor) carries out a switching in response to a signal (VBOOT) to connect or disconnect the gate of the NMOS transistor 152 and the main word line (GWL). An NMOS transistor 153 is connected between the output connection node (N0') and the ground voltage (VSS), and with its gate connected to the complementary main word line (/GWL). The sub word line drivers 150 perform a word line enable operation by driving the sub word lines in accordance with the sub decoding signals (SWD) and the main word line signals (GWL,/GWL).

Figure 9:
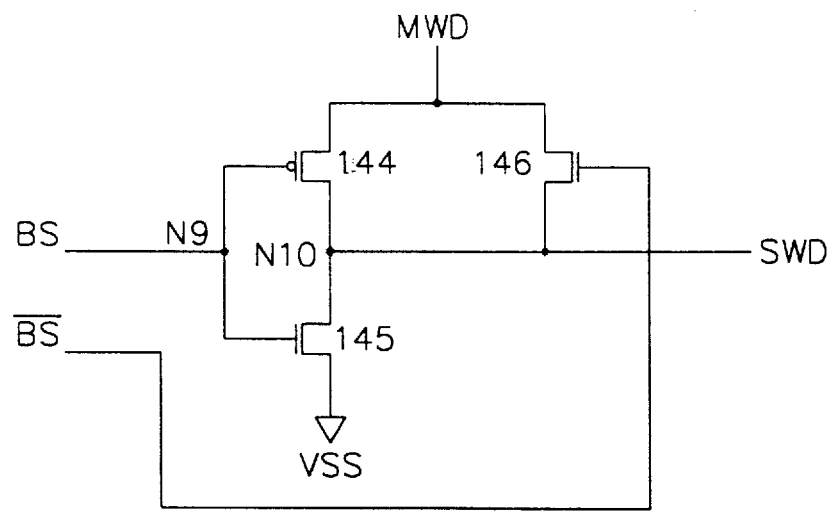
FIG. 9 is a detailed schematic circuit diagram of a block word decoder driver in the memory device of FIG. 4 according to another embodiment of the present invention.

FIG. 9 is a detailed circuit diagram of a block word decoder driver 140 (BWDDRV) in FIG. 4 according to another embodiment of the present invention. A CMOS inverter is employed for stabilizing the circuit operation and improving the operation speed. The block word decoder driver 140 includes a PMOS load transistor 144 connected between the main word decoding signal line (MWD) and an output connection node (N10) of the sub decoding signal (SWD), and with its gate connected to the block select signal (BS). An NMOS driver transistor 145 is connected between the connection node (N10) and the ground voltage (VSS), and with its gate connected to the block select signal (BS). An NMOS transistor 146 is connected between the main decoding signal line (MWD) and the output connection node (N10), and with its gate connected to an inverted block select signal (/BS).

Figure 10:
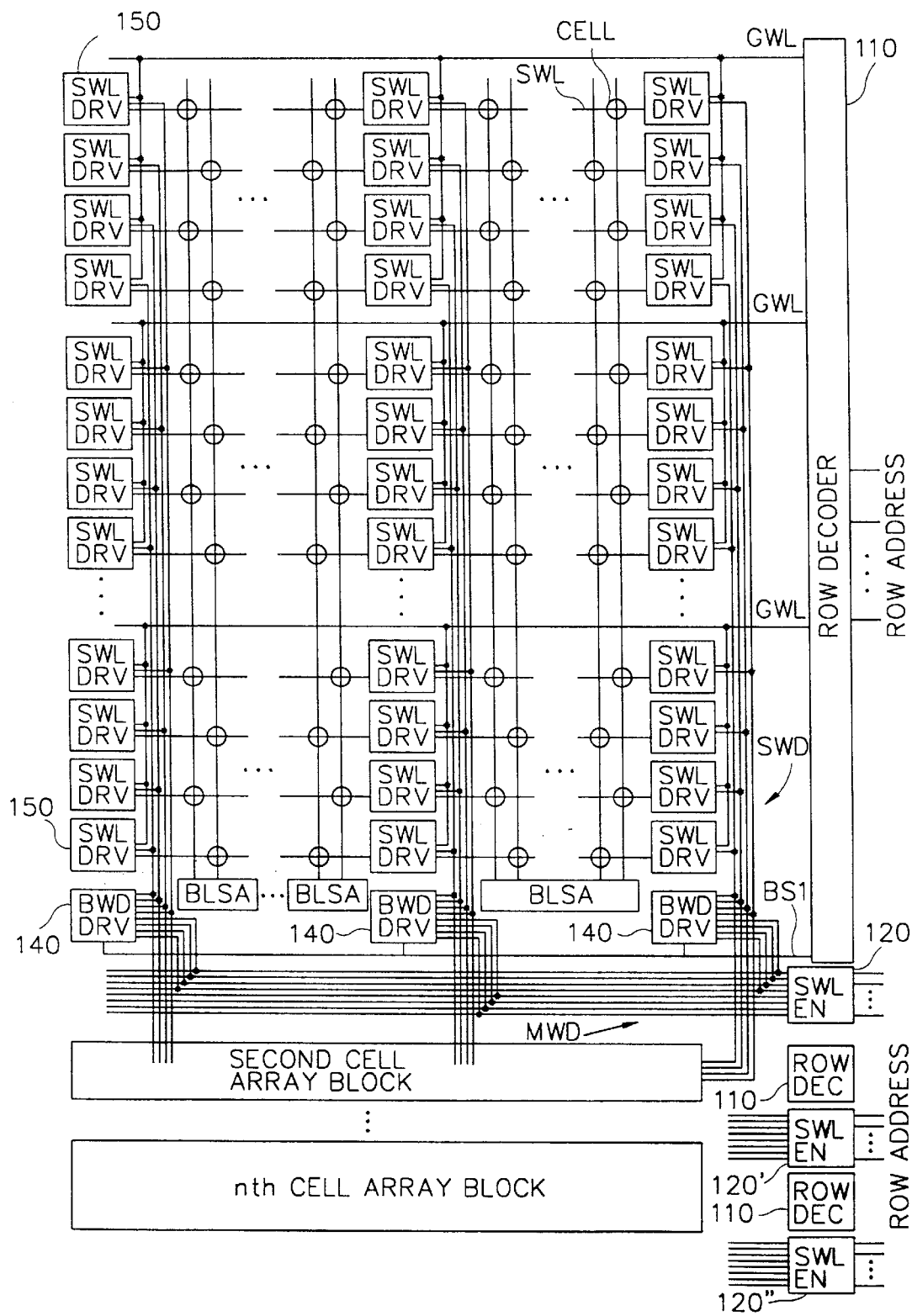
FIG. 10 is a schematic block diagram showing the construction of a semiconductor memory device according to a second embodiment of the present invention.

FIG. 10 is a block diagram of a semiconductor memory device having a word line driving structure according to a second embodiment of the present invention. In this second embodiment, the sub word line enable units 120 are arranged in the same direction as the row decoders 110.

As described above, the time required for enabling a word line can be reduced by arranging the word lines and sub word lines in a hierarchial structure, applying the decoding signals also in a hierarchial structure, and enabling the sub decoding signal only in the selected block. The overlap of currents generated in a plurality of decoding blocks can be reduced since one decoding operation may be carried out in the sub word line enable unit. Moreover, since a level shifter circuit is not adopted in the block word decoder driver, the overlap in the current flowing through a plurality of block word decoder drivers can be remarkably decreased. Further, since each block word decoder driver includes only three transistors, the layout area can be reduced and as a result, the chip size can be reduced in comparison with the conventional driver configuration which employs a level shifter.

It will be apparent to those skilled in the art that various modifications and variations can be made in the word line driver circuit for a semiconductor memory device of the present invention without departing from the spirit or scope of the invention. Thus, it is intended that the present invention cover the modifications and variations of this invention provided they come within the scope of the appended claims and their equivalents.

What is claimed is:

1. A word line driver for a semiconductor memory device, comprising:

a row decoder for generating a block select signal and driving a main word line in accordance with an address signal;

a sub word line enable unit for generating a main decoding signal in accordance with the address signal;

a word decoder driver for buffering the main decoding signal and transmitting the main decoding signal to a memory cell block;

a block word decoder driver for enabling a sub decoding signal in the memory cell block in accordance with the block select signal and the main decoding signal; and a sub word line driver for driving a sub word line in accordance with the sub decoding signal and the main word line driven by the row decoder.

2. The word line driver of claim 1, wherein the sub word line enable unit comprises:

a plurality of NAND gates each for performing a logical operation on the address signal and an enable signal and generating an output;

a plurality of level shifters each for receiving the output from one of the plurality of NAND gates and carrying out a level shifting; and a plurality of inverters each for inverting the output from one of the plurality of NAND gates, respectively.

3. The word line driver of claim 2, wherein each level shifter comprises:

a first PMOS transistor connected between a source voltage and a first node and having a gate connected to a second node;

a first NMOS transistor connected between the first node and a ground voltage and having a gate connected to the output from a corresponding NAND gate;

a second PMOS transistor connected between the source voltage and the second node and having a gate connected to the first node;

a second NMOS transistor connected between the second node and the ground voltage and having a gate connected to an inverted output from the corresponding NAND gate;

a first inverter for inverting a signal from the second node; and a second inverter for inverting an output signal from the first inverter.

4. The word line driver of claim 1, wherein the word decoder driver comprises two inverters connected in series.

5. The word line driver of claim 1, wherein the block word decoder driver comprises:

a first NMOS transistor connected between the word decoder driver and an output node and having a gate connected to the block select signal;

a switching device for carrying out a switching operation to conditionally apply the block select signal to the gate of the first NMOS transistor; and a second NMOS transistor connected between the output node and a ground voltage and having a gate connected to an inverted block select signal.

6. The word line driver of claim 1, wherein the block word decoder driver comprises:

a CMOS inverter including a load transistor and a driver transistor connected in series between the word decoder driver and a ground voltage and each receiving the block select signal at a gate thereof; and an NMOS transistor connected between an output node of the CMOS inverter and the word decoder driver and receiving an inverted block select signal at a gate thereof.

7. The word line driver of claim 1, wherein the sub word line driver comprises:

a first NMOS transistor connected between the sub word line and an output node and having a gate connected with a first main word line;

a switching device for carrying out a switching operation to conditionally connect the gate of the first NMOS transistor and the first main word line; and a second NMOS transistor connected between the output node and a ground voltage and having a gate connected to a second main word line.

8. The word line driver of claim 7, wherein the second main word line is complementary to the first main word line.

9. The word line driver of claim 7, wherein the switching device includes a pass transistor.

10. The word line driver of claim 1, wherein the row decoder is arranged in a first direction, and the sub word line enable unit is arranged in a second direction, the first direction being perpendicular to the second direction.

11. The word line driver of claim 1, wherein the row decoder is arranged in a first direction, the sub word line enable unit is arranged in a second direction, the first direction and the second direction being parallel to each other.

* * * * *